United States Patent
Jeon

(10) Patent No.: US 10,840,150 B2
(45) Date of Patent: Nov. 17, 2020

(54) SEMICONDUCTOR DEVICE AND METHOD FOR MANUFACTURING THE SAME

(71) Applicant: SAMSUNG ELECTRONICS CO., LTD., Suwon-si (KR)

(72) Inventor: Kyung Yub Jeon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 289 days.

(21) Appl. No.: 15/843,694

(22) Filed: Dec. 15, 2017

(65) Prior Publication Data

US 2018/0197790 A1    Jul. 12, 2018

Related U.S. Application Data

(60) Provisional application No. 62/444,544, filed on Jan. 10, 2017.

(51) Int. Cl.

| | | |
|---|---|---|
| *H01L 21/8238* | (2006.01) | |
| *H01L 21/308* | (2006.01) | |
| *H01L 21/311* | (2006.01) | |
| *H01L 29/66* | (2006.01) | |
| *H01L 29/78* | (2006.01) | |
| *H01L 27/092* | (2006.01) | |

(52) U.S. Cl.
CPC .. *H01L 21/823814* (2013.01); *H01L 21/3081* (2013.01); *H01L 21/3085* (2013.01); *H01L 21/3086* (2013.01); *H01L 21/31144* (2013.01); *H01L 21/823885* (2013.01); *H01L 27/092* (2013.01); *H01L 29/66666* (2013.01); *H01L 29/7827* (2013.01); *H01L 21/823864* (2013.01)

(58) Field of Classification Search
None
See application file for complete search history.

(56) References Cited

U.S. PATENT DOCUMENTS

| | | | |
|---|---|---|---|
| 6,352,909 B1 | 3/2002 | Usenko | |
| 8,178,442 B2 | 5/2012 | Park et al. | |
| 8,227,354 B2 | 7/2012 | Kim et al. | |
| 8,900,956 B2 * | 12/2014 | Chung | H01L 21/82380 438/230 |
| 9,117,654 B2 | 8/2015 | Lee et al. | |
| 9,324,574 B2 | 4/2016 | Kang | |
| 10,475,904 B2 * | 11/2019 | Niimi | H01L 29/7788 |

(Continued)

FOREIGN PATENT DOCUMENTS

| | | |
|---|---|---|
| KR | 1020120120639 | 11/2012 |
| KR | 1020120121175 | 11/2012 |

*Primary Examiner* — Angel Roman
(74) *Attorney, Agent, or Firm* — F. Chau & Associates, LLC

(57) ABSTRACT

A method for manufacturing a semiconductor is provided. A first oxide layer is formed on a substrate. A first nitride layer is formed on the first oxide layer. A second oxide layer, a second nitride layer are formed on the first nitride layer. A polysilicon layer is formed on the second nitride layer. A third nitride layer is formed on the polysilicon layer. One or more first patterns are formed on the third nitride layer. The one or more first patterns are transferred to the polysilicon layer to form one or more patterned polysilicon layer. A portion of the first oxide layer, first nitride layer, second oxide layer, and second nitride layer are removed using the one or more patterned polysilicon layer as a first mask.

13 Claims, 19 Drawing Sheets

(56) References Cited

U.S. PATENT DOCUMENTS

2016/0027783 A1    1/2016  Koge
2016/0307803 A1   10/2016  Mun et al.
2019/0378767 A1*  12/2019  Bao ..................... H01L 21/324
2020/0035828 A1*   1/2020  Cheng ............... H01L 21/82386

* cited by examiner (a)

(d)

(b)

(e)

(c)
P-MOS (f)
N-MOS

SEMICONDUCTOR DEVICE AND METHOD FOR MANUFACTURING THE SAME

CROSS-REFERENCE TO RELATED APPLICATION

This application claims the benefit under 35 U.S.C. § 119 to U.S. Provisional Patent Application No. 62/444,544, filed on Jan. 10, 2017 in the U.S. Patent and Trademark Office, the disclosure of which is incorporated by reference herein in its entirety.

TECHNICAL FIELD

The present inventive concept relates to a semiconductor device and a method for fabricating the same.

DISCUSSION OF RELATED ART

In integrated circuits manufactured using metal-oxide-semiconductor (MOS) technology, field effect transistor (FET) may be typically operated in a switching mode. For example, FET exhibits a highly conductive state (on-state) and a high impedance state (off-state). For example, among other configurations, FET may include a bottom source/drain region, a vertical channel, and a top source/drain region to form a vertical structure, which may be referred to as a fin in the FET.

The vertical structure may be under a plurality of processing steps including dry etching or wet etching. During the etching process, a portion of the vertical structure may be consumed. Accordingly, the height of the vertical structures may not be uniform with each other.

SUMMARY

According to an exemplary embodiment of the present inventive concept, a method for manufacturing a semiconductor device includes forming a first oxide layer on a substrate, forming a first nitride layer on the first oxide layer. The method further includes forming a second oxide layer on the first nitride layer, and forming a second nitride layer on the second oxide layer. The method still further includes forming a polysilicon layer on the second nitride layer, and forming a third nitride layer on the polysilicon layer. The method further includes forming a plurality of first patterns on the third nitride layer, and transferring the plurality of first patterns to the polysilicon layer to form a plurality of polysilicon patterns. The method still further includes removing a portion of the first oxide layer, first nitride layer, second oxide layer, and second nitride layer using the plurality of polysilicon patterns as a mask.

According to an exemplary embodiment of the present inventive concept, a method for manufacturing a semiconductor device includes forming a channel extending form a substrate. The method further includes forming a first oxide layer, a first nitride layer, a second oxide layer, and a second nitride layer sequentially on the channel to form a vertical structure. The method still further includes forming an oxide spacer on the outer surface of the vertical structure, and forming a first nitride spacer on the oxide spacer. The method further includes forming a second nitride spacer on the outer surface of the vertical structure.

According to an exemplary embodiment of the present inventive concept, a method for manufacturing a semiconductor device includes forming a first plurality of vertical structures, and a second plurality of vertical structures. Each of the vertical structures includes a vertical channel, a first oxide, a first nitride, a second oxide, and a second nitride. The method further includes forming a first oxide layer on an outer surface of the each of the vertical structures, and forming a first nitride layer on the first oxide layer. The method still further includes covering the first plurality of vertical structures using a first mask to expose the second plurality of vertical structures. The method still further includes removing a portion of the substrate between the second plurality of vertical structures. The method further includes removing the first mask. The method still further includes forming a second nitride layer on the outer surface of the first and second pluralities of vertical structures. The method further includes covering the second plurality of vertical structures using a second mask to expose the first plurality of vertical structures. The method still further includes removing a portion of the substrate between the first plurality of vertical structures. The method further includes removing the second mask. The first plurality of vertical structures is different from the second plurality of vertical structures.

According to an exemplary embodiment of the present inventive concept, a semiconductor device includes a plurality of bottom epitaxial layers, and a plurality of vertical channels formed respectively on the plurality of bottom epitaxial layers. The semiconductor device further includes a plurality of top epitaxial layers formed respectively on the plurality of vertical channels. The semiconductor device still further includes an insulating layer formed between adjacent vertical channels. The plurality of top epitaxial layers is separated by the insulating layer. An upper surface of the insulating layer is higher than the upper surface of the vertical channel.

According to an exemplary embodiment of the present inventive concept, a method for manufacturing a semiconductor device includes forming a first oxide layer on a substrate, forming a first nitride layer on the first oxide layer. The method further includes forming a second oxide layer on the first nitride layer, and forming a second nitride layer on the second oxide layer. The method still further includes forming a polysilicon layer on the second nitride layer, and forming a first sacrificial layer on the polysilicon layer. The method further includes forming a second sacrificial layer on the first sacrificial layer, and transferring the plurality of patterns to the first and second sacrificial layers and the polysilicon layer to form a plurality of polysilicon patterns. The method still further includes removing a portion of the first oxide layer, first nitride layer, second oxide layer, and second nitride layer using the plurality of polysilicon patterns as a mask.

BRIEF DESCRIPTION OF THE DRAWINGS

The present inventive concept will become more apparent by describing in detail exemplary embodiments thereof with reference to the attached drawings, in which.

DETAILED DESCRIPTION OF EMBODIMENTS

The present inventive concept will now be described more fully hereinafter with reference to the accompanying drawings, in which exemplary embodiments of the inventive concept are shown. The inventive concept may, however, be embodied in different forms and should not be construed as limited to the exemplary embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. Like numbers refer to like elements throughout.

It will also be understood that when a layer is referred to as being "on" another layer or substrate, it can be directly on the other layer or substrate, or intervening layers may also be present.

The use of the terms "a" and "an" and "the" in the context of describing the invention are to be construed to cover both the singular and the plural, unless otherwise indicated herein or clearly contradicted by context.

Hereinafter, a method of generating a semiconductor device according to an exemplary embodiment of the inventive concept will be described with reference to FIGS. 1 to 37.

Figure 1:
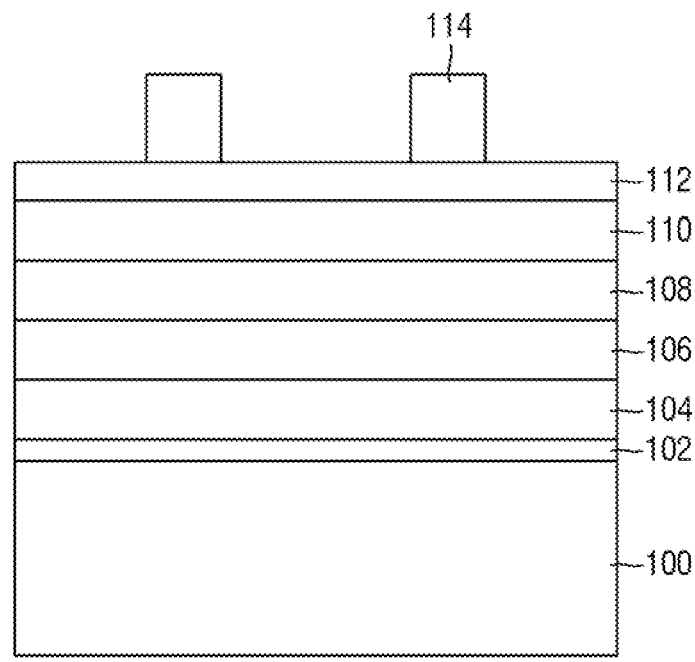
FIG. 1 illustrates cross-sectional view illustrating a method of forming a plurality of layers during manufacture of a semiconductor device according to an exemplary embodiment of the present inventive concept.

Referring to FIG. 1, manufacturing a semiconductor device may include forming a plurality of layers on a substrate 100 according to an exemplary embodiment of the present inventive concept. The substrate 100 may include, for example, silicon (Si), germanium (Ge), silicon-germanium (SiGe), III-V compound semiconductor, or the like. In one embodiment, the semiconductor device may include a p-MOS (p-type metal oxide semiconductor) region including a plurality of the p-MOS transistors, and an n-MOS (n-type metal oxide semiconductor) region including a plurality of the n-MOS transistors. For example, each transistor may include a gate, a drain, a source, and a channel positioned between the drain and the source. In one embodiment, the transistor may include a bottom source/drain, a top source/drain, and a vertical channel formed between the bottom source/drain and the top source/drain.

A first oxide layer 102 may be formed on the substrate 100 by, for example, an in-situ steam generation (ISSG) process. In one embodiment, the first oxide layer 102 may not be formed on the substrate 100. A first silicon nitride layer 104 may be formed on the first oxide layer 102 by, for example, chemical vapor deposition (CVD). A second oxide layer 106 may be formed on the first silicon nitride layer 104. A second silicon nitride layer 108 may be formed on the second oxide layer 106, and a polysilicon layer 110 may be formed on the second silicon nitride layer 108. A third silicon nitride layer 112 may be formed on the polysilicon layer 110.

In an embodiment, the first oxide layer 102 may have a thickness of about 1.4 nm. In an embodiment, the second oxide layer 106 may have the thickness ranging from about 12 nm to about 20 nm. In an embodiment, the first silicon nitride layer 104 and the second silicon nitride layer 108 may have a thickness of about 50 nm. In an embodiment, the third silicon nitride layer 112 may have a thickness of about 15 nm.

A plurality of first sacrificial patterns 114 may be formed on the third silicon nitride layer 112. In one embodiment, the plurality of first sacrificial patterns 114 may include a polysilicon, an amorphous carbon layer (ACL), a spin-on-harder ask (SOH), a photoresist, or a combination thereof. The first sacrificial patterns 114 may be formed by photolithography process.

Figure 2:
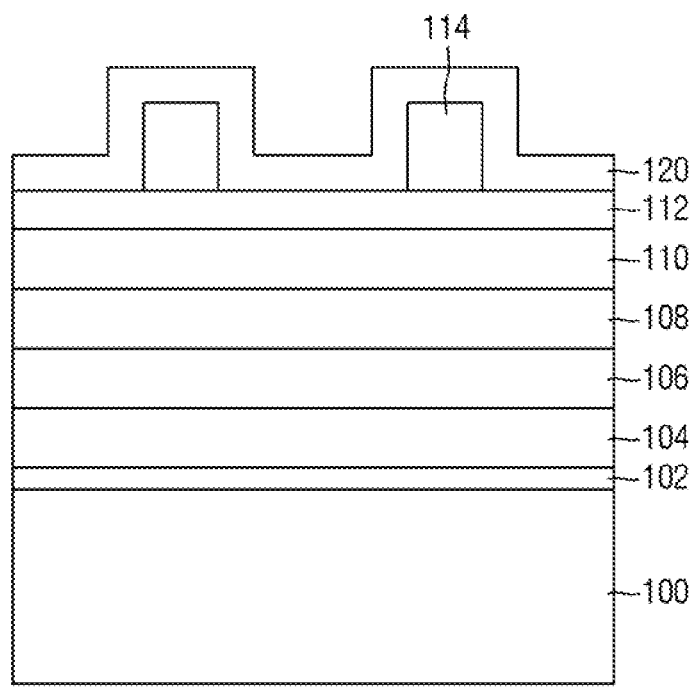
FIG. 2 illustrates cross-sectional view illustrating a method of forming a spacer layer during manufacture of a semiconductor device according to an exemplary embodiment of the present inventive concept.

Referring to FIG. 2, a spacer layer 120 may be formed on the first sacrificial patterns 114 according to an exemplary embodiment of the present inventive concept. In one embodiment, the spacer layer 120 may be formed to conformably cover the substantially entire outer surface of the plurality of the first sacrificial patterns 114 on the substrate 100. The spacer layer 120 may include a material that has selectivity with respect to the first sacrificial pattern 114. In one embodiment, the spacer layer 120 may include, for example, silicon oxide, and may be formed by, for example, CVD or atomic layer deposition (ALD). The thickness of the spacer layer 120 may be controlled by controlling the deposition time of the spacer layer 120.

Figure 3:
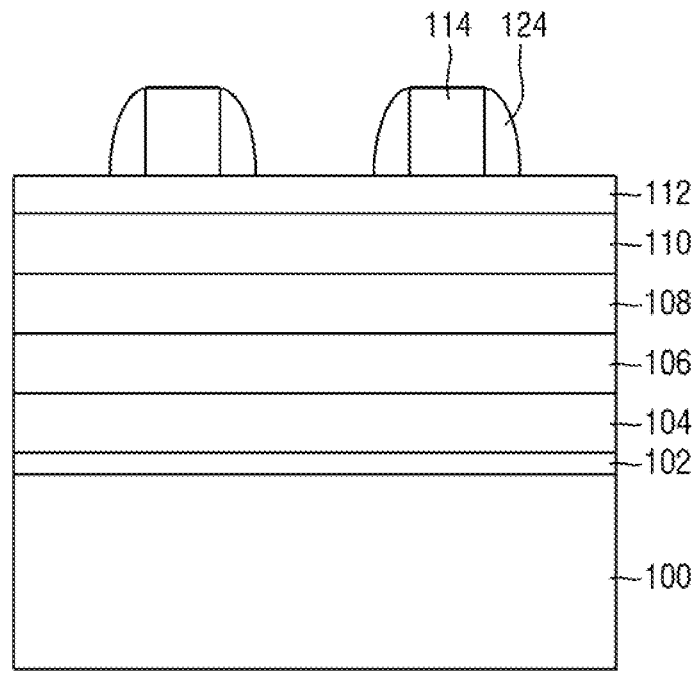
FIG. 3 illustrates cross-sectional view illustrating a method of forming a plurality of spacers during manufacture of a semiconductor device according to an exemplary embodiment of the present inventive concept.

Referring to FIG. 3, a portion of the spacer layer 120 may be removed to form a plurality of spacers 124 on the sidewalls of the first sacrificial patterns 114 by etching the spacer layer 120 according to an exemplary embodiment of the present inventive concept. In one embodiment, the spacer layer 120 may be etched by dry etching until an upper portion of the first sacrificial pattern 114 is exposed. The spacers 124 having a predetermined thickness may be used as a mask in forming predetermined patterns in the subsequent process.

Figure 4:
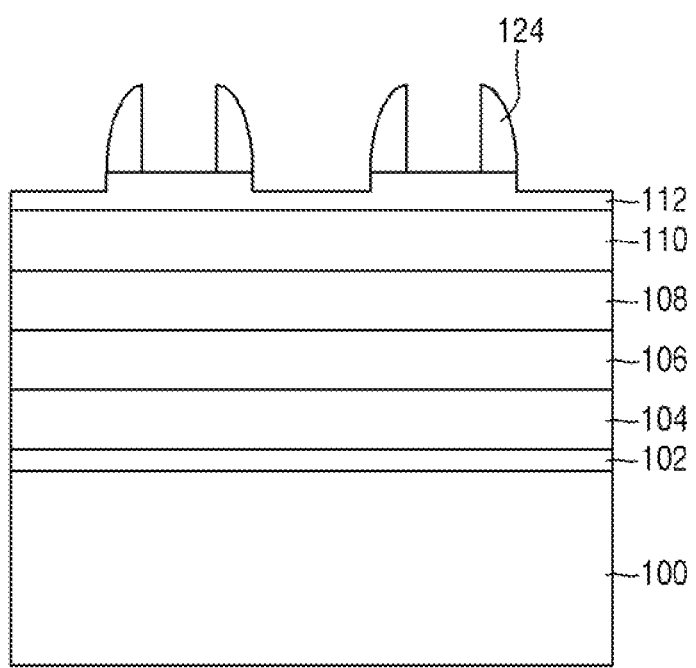
FIG. 4 illustrates cross-sectional view illustrating a method of removing first sacrificial patterns during manufacture of a semiconductor device according to an exemplary embodiment of the present inventive concept.

Referring to FIG. 4, the first sacrificial patterns 114 may be removed by etching process to have the spacers 124 positioned with a predetermined spacing between the spacers 124 according to an exemplary embodiment of the present inventive concept. In one embodiment, the first sacrificial patterns 114 may be selectively etched by dry etching or reactive ion etching with respect to the spacers 124. In one embodiment, when the first sacrificial patterns 114 are removed, the third silicon nitride layer 112, which is positioned underneath the first sacrificial patterns 114, may also be etched to have a reduced thickness of the third silicon nitride layer 112 compared to an initial thickness of the third silicon nitride layer 112. In one embodiment, during etching of the first sacrificial patterns 114, the third silicon nitride layer 112 may protect the underlying polysilicon layer 110 from being damaged during the etching process. For example, the distance between the adjacent spacers 124 may be the same as a width of the first sacrificial pattern 114.

Figure 5:
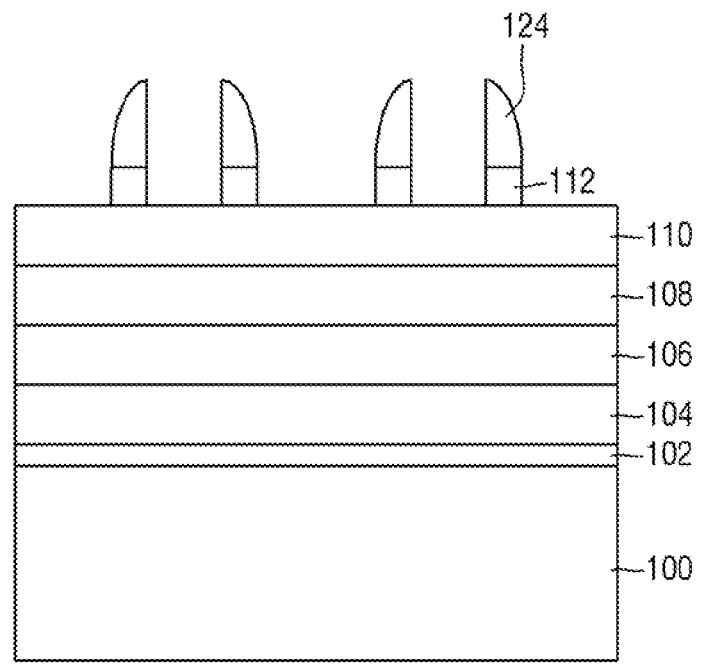
FIG. 5 illustrates cross-sectional view illustrating a method of etching a third silicon nitride layer during manufacture of a semiconductor device according to an exemplary embodiment of the present inventive concept.
Figure 6:
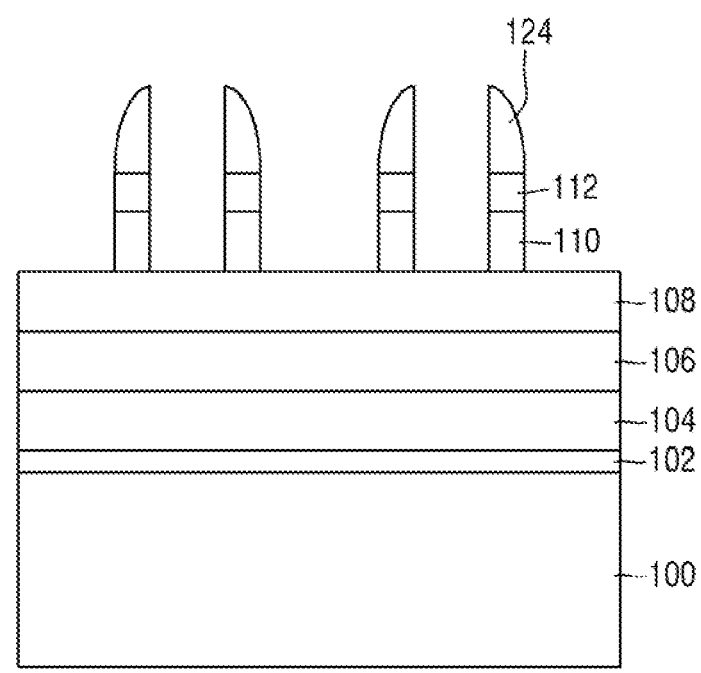
FIG. 6 illustrates cross-sectional view illustrating a method of etching a polysilicon layer during manufacture of a semiconductor device according to an exemplary embodiment of the present inventive concept.

FIGS. 5 and 6 illustrate etching the third silicon nitride layer 112 and the polysilicon layer 110 using the spacers 124 as the mask according to an exemplary embodiment of the present inventive concept. The third silicon nitride layer 112 may be etched using the spacers 124 as the mask as shown in FIG. 5. For example, the patterns of the spacers 124 may be transferred to the third silicon nitride layer 112 to have the same patterns as the spacers 124. As shown in FIG. 6, the polysilicon layer 110 may be etched after the third silicon nitride layer 112 is etched using the spacers 124 and the polysilicon layer 110 as the mask. During the etching of the polysilicon layer 110, the patterns of the spacers 124 may be transferred to the polysilicon layers 110. For example, the width of the spacers 124 may be substantially same as the width of the third silicon nitride layer 112 and the polysilicon layer 110.

Figure 7:
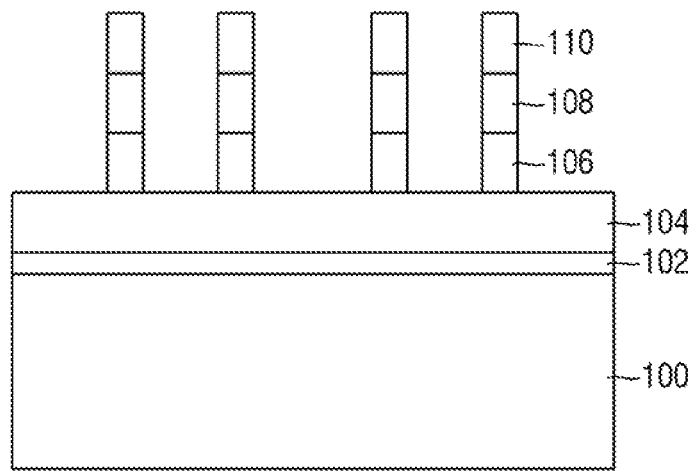
FIGS. 7-8 illustrate cross-sectional views illustrating a method of etching a plurality of layers using the polysilicon as the mask during manufacture of a semiconductor device according to an exemplary embodiments of the present inventive concept.

Referring to FIG. 7, the spacers 124 and the third silicon nitride layer 112 may be removed by, for example, dry etching, to expose the polysilicon layer 110 according to an exemplary embodiment of the present inventive concept. The polysilicon layer 110 may be used as the mask in patterning underlying layers in the subsequent steps. In one embodiment, the polysilicon layer 110 may be used as the mask in etching the second silicon nitride layer 108 and the second oxide layer 106. During the etching, the second silicon nitride layer 108 may also protect underlying layers, for example, the second oxide layer 106, the first silicon nitride layer 104, and the first oxide layer 102 from being damaged during the subsequent etching processes. In another example, the second oxide layer 106 may be formed to protect the underlying first silicon nitride layer 104 from the subsequent dry or wet etching process.

Figure 8:
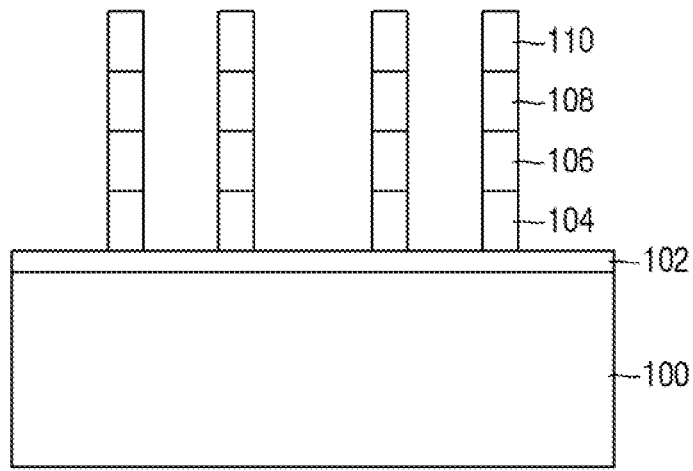

FIG. 8 illustrates etching of the first silicon nitride layer 104 using the polysilicon layer 110 as the mask according to an exemplary embodiment of the present inventive concept. After the second silicon nitride layer 108, the second oxide layer 106, the first silicon nitride layer 104, and the first oxide layer 102 are etched using the polysilicon layer 110 as the mask, the polysilicon layer 110 may be etched away by, for example, dry etching or wet etching.

Figure 9:
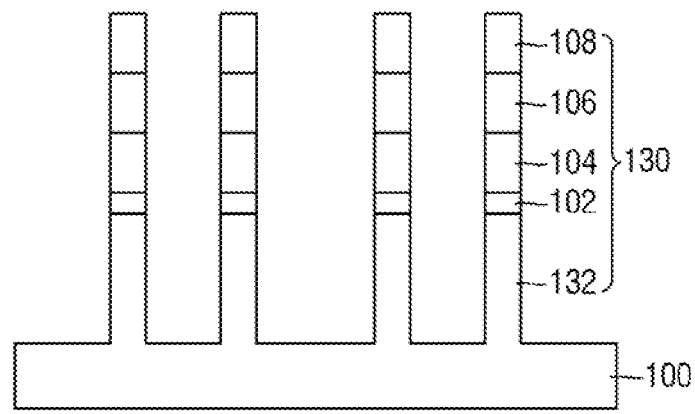
FIG. 9 illustrates cross-sectional view illustrating a method of etching a portion of the substrate during manufacture of a semiconductor device according to an exemplary embodiment of the present inventive concept.

FIG. 9 illustrates etching of the substrate 100 using the second silicon nitride layer 108 as the mask according to an exemplary embodiment of the present inventive concept. In another embodiment, the mask may include the second silicon nitride layer 108, the second oxide layer 106, the first silicon nitride layer 104, and the first oxide layer 102 in etching a portion of the substrate 100. In one embodiment, the silicon substrate 100 may be etched down by a predetermined depth to form a channel 132 for a vertical structure 130. In one embodiment, the vertical structure 130 may include the second silicon nitride layer 108, the second oxide layer 106, the first silicon nitride layer 104, the first oxide layer 102, and a channel 132. In another embodiment, the vertical structure 130 may include the second silicon nitride layer 108, the second oxide layer 106, the first silicon nitride layer 104, and the channel 132. In one embodiment, when the etching of the substrate 100 is performed, the second silicon nitride layer 108 may have an angular shaped upper portion as shown in FIG. 9. In another embodiment, the upper portion of the second silicon nitride layer 108 may be a rounded shape.

Referring to FIGS. 10-16, a method of forming the vertical structure 130 using the polysilicon layer 110 is illustrated according to one or more exemplary embodiments of the present inventive concept. The method for manufacturing the vertical structure 130 as illustrated in FIGS. 10-16, which shares many steps of manufacturing the vertical structure 130 as illustrated in. FIGS. 1-9, would not be described in detail herein except as necessary for a complete understanding of an embodiment.

Figure 10:
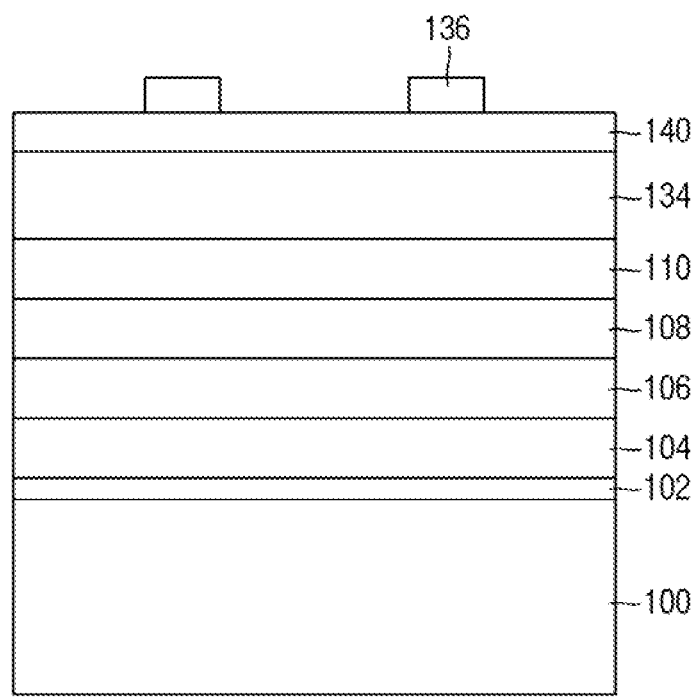
FIG. 10 illustrates cross-sectional view illustrating a method of forming a plurality of layers during manufacture of a semiconductor device according to an exemplary embodiment of the present inventive concept.

Referring FIG. 10, the first oxide layer 102, the first oxide layer 102, the first silicon nitride layer 104, the second oxide layer 106, the second silicon nitride layer 108, and the polysilicon layer 110 may be formed on the substrate 100. A second sacrificial layer 134 may be formed on the polysilicon layer 110. The second sacrificial layer 134 may include, for example, the spin-on-hardmask (SOH) or the amorphous carbon layer (ACL). A third sacrificial layer 140 may be formed on the second sacrificial layer 134. In one embodiment, the third sacrificial layer 140 may include silicon oxynitride (SiON), and may be formed by, for example, CVD, ALD, or spin coating. A plurality of photoresist patterns 136 may be formed on the third sacrificial layer 140 using a photolithography process.

Figure 11:
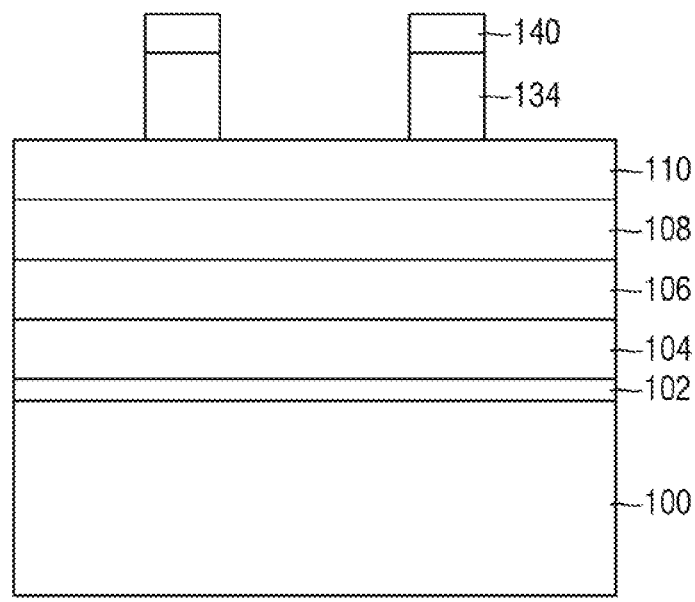
FIG. 11 illustrates cross-sectional view illustrating a method of patterning first and second sacrificial layers during manufacture of a semiconductor device according to an exemplary embodiment of the present inventive concept.
Figure 12:
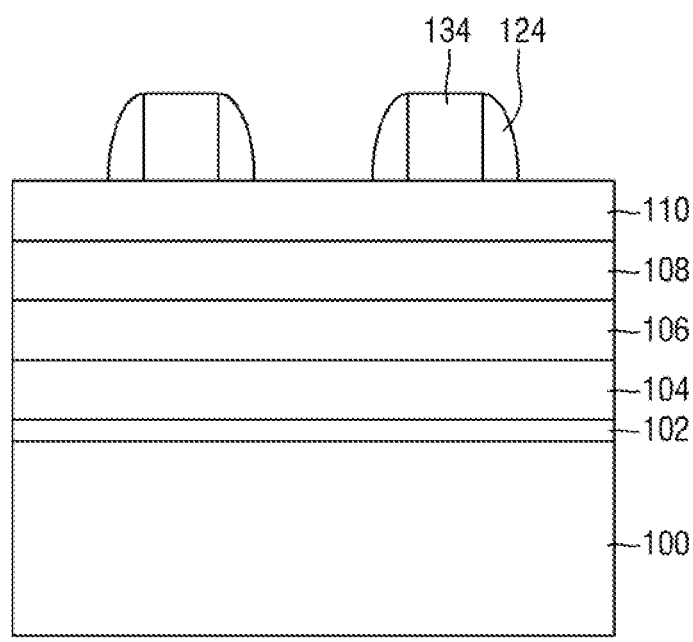
FIG. 12 illustrates cross-sectional view illustrating a method of forming a plurality of spacers during manufacture of a semiconductor device according to an exemplary embodiment of the present inventive concept.
Figure 13:
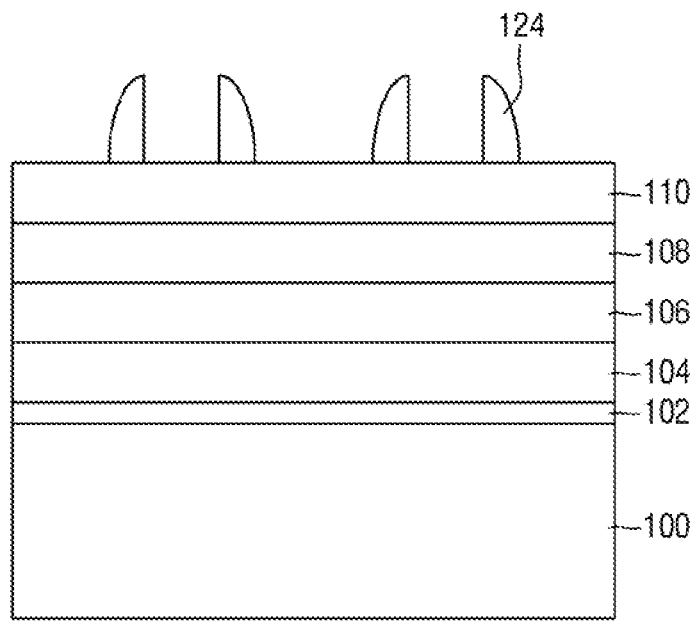
FIG. 13 illustrates cross-sectional view illustrating a method of removing first sacrificial patterns during manufacture of a semiconductor device according to an exemplary embodiment of the present inventive concept.

FIG. 11 illustrates patterning the second and third sacrificial layers 134, 140 using the photoresist patterns 136 as the mask by, for example, dry etching. After the second and third sacrificial layers 134, 140 are patterned, the photoresist patterns 136 may be removed to expose the third sacrificial layer 140. FIG. 12 illustrates that the plurality of the spacers 124 may be formed on the side walls of the second sacrificial layer 134. While not shown, the spacer layer may be conformally formed on the second sacrificial layer 134, and the spacer layer may be etched to form a plurality of the spacers 124 as shown in FIG. 12. The third sacrificial layer 140 may be removed prior to the formation of the spacers 124. FIG. 13 illustrates that the second sacrificial layer 134 may be removed by, for example, dry etching, and the spacers 124 may be positioned on the polysilicon layer 110 to form one or more patterns. In one embodiment, the distance between the spacers 124 may be the same as the width of the second sacrificial layer 134. The width of the spacers 124 may be determined by the thickness of the spacer layer.

Figure 14:
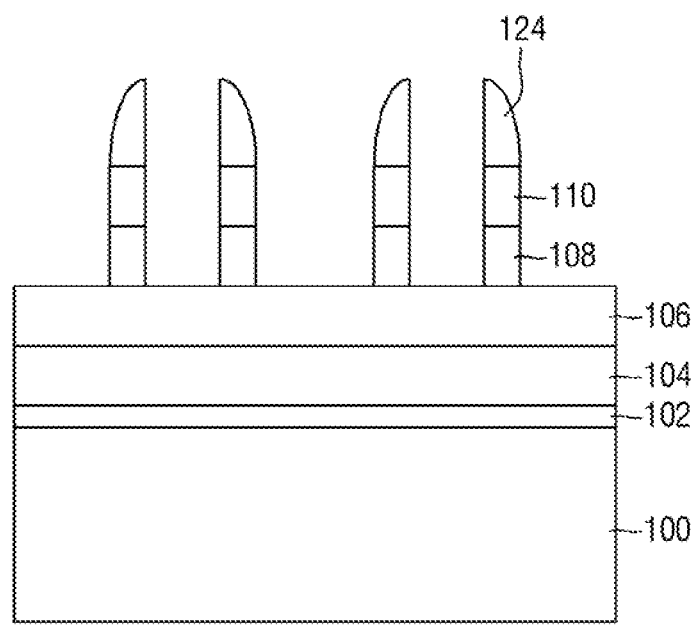
FIGS. 14-16 illustrate cross-sectional views illustrating a method of forming a vertical structure during manufacture of a semiconductor device according to one or more exemplary embodiments of the present inventive concept.
Figure 15:
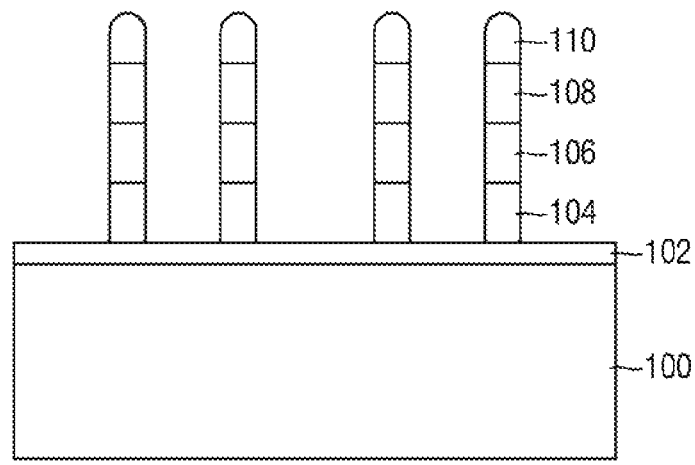
Figure 16:
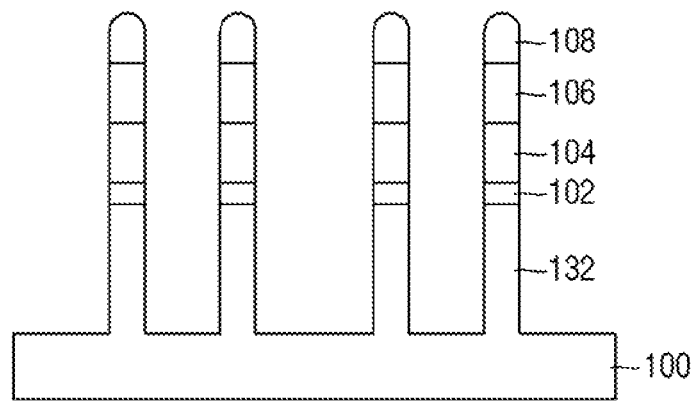

FIGS. 14-16 illustrate manufacture of the vertical structure 130 according to one or more exemplary embodiments of the present inventive concept. As shown in FIG. 14, the polysilicon layer 110 and the second silicon nitride layer 108 may be patterned using the spacers 124 as the mask by, for example, dry etching. Referring to FIG. 15, a portion of the second oxide layer 106 and the first silicon nitride layer 104 may be removed using the spacers 124 and the polysilicon layer 110 as the mask. In one embodiment, the spacers 124 may be substantially removed when the second oxide layer 106 and the first silicon nitride layer 104 are patterned. In one embodiment, an upper portion of the polysilicon layer 110 may be removed when the second oxide layer 106 and the first silicon nitride layer 104 are patterned.

FIG. 16 illustrates that the substrate 100 may be etched by, for example, dry etching, using the second silicon nitride layer 108 as the mask. In another one embodiment, the substrate 100 may be etched using, for example, the second silicon nitride layer 108, the second oxide layer 106, the first silicon nitride layer 104, and the first oxide layer 102 as the mask. The substrate 100 may be etched for a predetermined time to form one or more trenches to define the vertical channels 132 in the substrate 100. After the substrate 100 is etched, the vertical structure 130 including the second silicon nitride layer 108, second oxide layer 106, first silicon nitride layer 104, and first oxide layer 102, and the vertical channel 132 may be formed. In one example, an upper portion of the second silicon nitride layer 108 may be formed to have a rounded upper portion.

Figure 17:
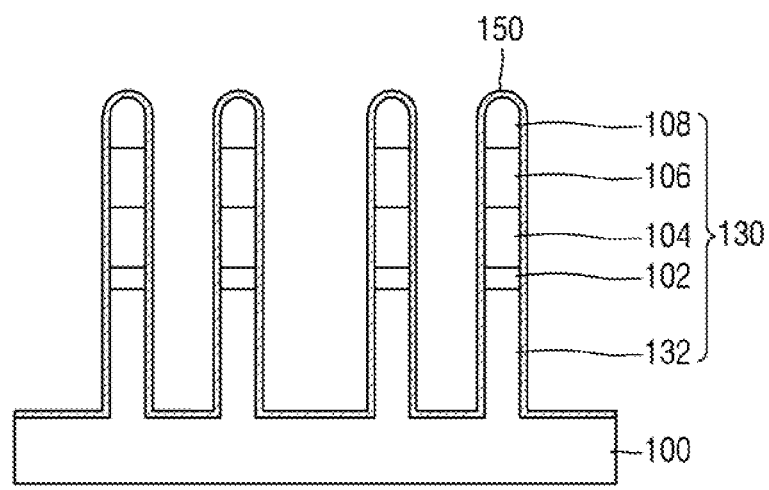
FIG. 17 illustrates cross-sectional view illustrating a method of forming an oxide spacer during manufacture of a semiconductor device according to an exemplary embodiment of the present inventive concept.

Referring to FIG. 17 an oxide spacer 150 may be conformally formed on the outer surface of the vertical structure 130 and the substrate 100 to form a continuous layer according to an exemplary embodiment of the present inventive concept. For example, the oxide spacer 150 may include silicon oxide, and may be formed by CVD or ALD to form a protective layer on the vertical structure 130.

Figure 18:
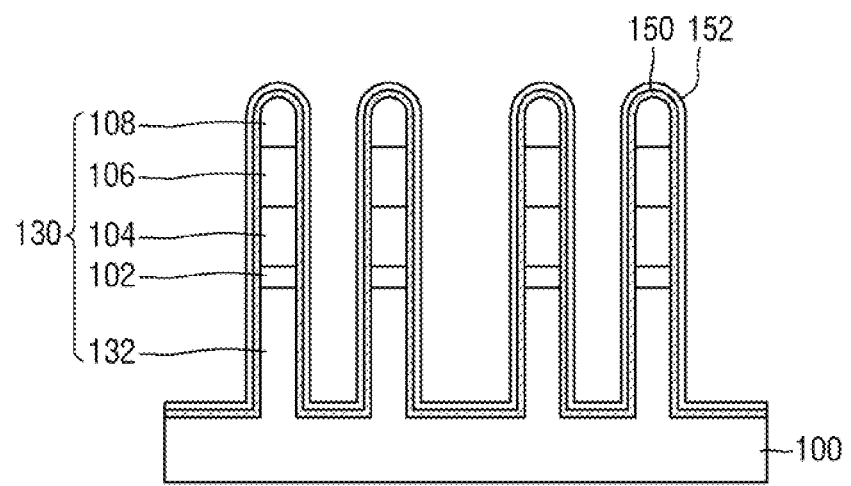
FIG. 18 illustrates cross-sectional view illustrating a method of forming a first nitride spacer during manufacture of a semiconductor device according to an exemplary embodiment of the present inventive concept.

Referring to FIG. 18, a first nitride spacer 152 may be conformally formed according to an exemplary embodiment of the present inventive concept. The first nitride spacer 152 may be formed on the oxide spacer 150 using, for example, CVD or ALD. The first nitride spacer 152 may include, for example, silicon nitride.

Figure 19:
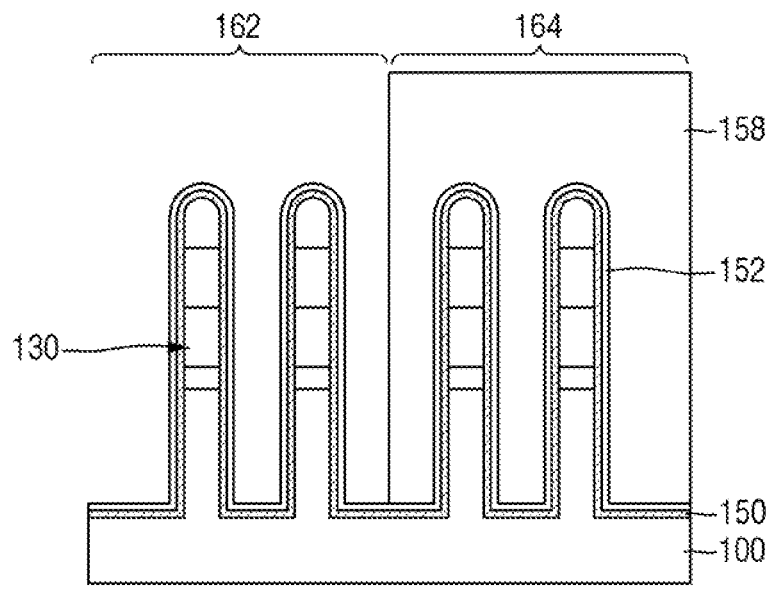
FIGS. 19-21 illustrate cross-sectional views illustrating a method of forming bottom epitaxial layers during manufacture of a semiconductor device according to one or more exemplary embodiments of the present inventive concept.
Figure 20:
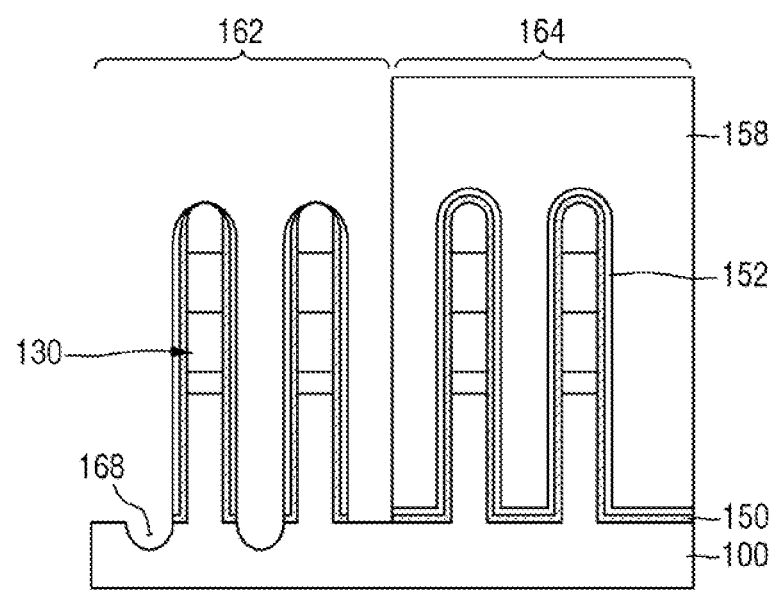
Figure 21:
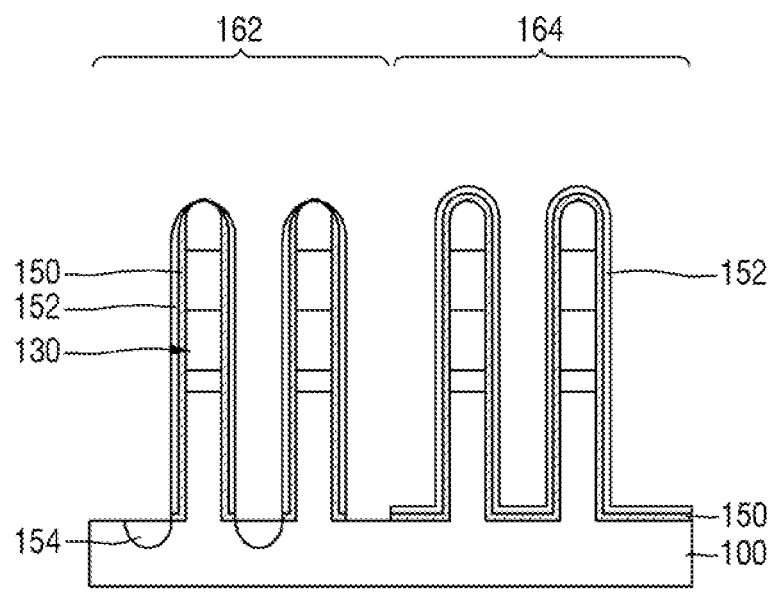

Referring to FIGS. 19-21, a plurality of bottom epitaxial layers may be selectively formed for one of p-MOS region or n-MOS region of the semiconductor device according to one or more exemplary embodiments of the present inventive concept. For example, as shown in FIG. 19, the p-MOS region 162 of the semiconductor device may be opened to expose a first plurality of vertical structures 130, and the n-MOS region 164 of the semiconductor device 10 may be covered by an insulating layer 158 to prevent the bottom epitaxial layers of a second plurality of vertical structures 130 from being formed. In one embodiment, the insulating layer 158 may include, for example, an organic planarization layer (OPL), the amorphous carbon layer (ACL) or the spin-on-hardmask (SOH). The insulating layer 158 may be formed on the vertical structures 130 and selectively patterned to have the p-MOS region 162 exposed.

Referring to FIG. 20, one or more recesses 168 may be formed in the substrate 100 in either side of the vertical structure 130 in the p-MOS region 162 by removing portions of the substrate 100. In one embodiment, an etching process may be performed to form the recesses 168 in the substrate 100 using, for example, dry etching using the vertical structure 130 covered with the oxide spacer 150 and the first nitride spacer 152 as the mask. After the etching process, the recesses 168 with a predetermined depth may be formed.

When the recesses 168 are formed in the substrate 100, the oxide spacer 150 and the first nitride spacer 152 may be affected by the etching process as well. In one embodiment, the upper portion of the first nitride spacer 152 and/or the oxide spacer 150 may be at least partially etched by ions or other reactive gas species from dry etching process. Therefore, after the recesses 168 are formed, the combined thickness of the first nitride spacer 152 and/or the oxide spacer 150 near the upper portion of the vertical structure 130 may become thinner than the combined thickness of the as deposed first nitride spacer 152 and/or the oxide spacer 150 formed on the vertical structure 130. In another embodiment, the first nitride spacer 152 may be substantially removed to expose the oxide spacer 150. In yet another embodiment, both the first nitride spacer 152 and the oxide spacer 150 may be substantially etched to expose the second silicon nitride layer 108 as shown in FIG. 20. In any case, the combined thickness of the first nitride spacer 152 and/or the oxide spacer 159 may be thinner than the combined thickness of the as deposed first nitride spacer 152 and/or the oxide spacer 150.

When the recesses 168 are formed, the ions or other reactive gas species from the dry etching may remove a portion of the first nitride spacer 152 formed at the sidewalls of the vertical structure 130. As a result, the thickness of the first nitride spacer 152 at the sidewalk of the vertical structure 130 may become thinner than an initial thickness of the as deposited first nitride spacer 152 at the sidewalls of the vertical structure 130.

In the n-MOS region 164, none of the oxide spacer 150 and the first nitride spacer 152 may he affected by the recess forming process since the n-MOS region 164 is covered by the insulating layer 158. which may isolate the n-MOS region 164 from the ions and other reactive gas species from the etching process.

Referring to FIG. 21, the epitaxial layer 154 may he formed in the recesses 168 in the p-MOS region 162. In one embodiment, the epitaxial layer 154 may be semiconductor material, and may include, for example, silicon (Si), germanium (Ge), silicon-germanium (SiGe) or the like. The present inventive concept, however, is not limited thereto. In one embodiment, ion implantation may be performed to supply either n-type or p-type impurities in the epitaxial layer 154 for modifying electrical properties of the epitaxial layer 154 filled in the recesses 168. For example, for the p-MOS region 162, the epitaxial layer 154 may include p-type dopants, for example, boron (B) or aluminium (Al). The present inventive concept, however, is not limited thereto, and other p-type dopant materials may be used. When the ion implantation is performed, at a later stage of the manufacture of the semiconductor device, a heat treatment may be separately performed at a predetermined temperature to control the diffusion and distribution of the impurities in the epitaxial layer 154.

FIG. 21 further illustrates that the insulating layer 158 covering the n-MOS region 164 may be removed by, for example, dry etching after the epitaxial layers 154 are formed in the p-MOS region 162. As described above, after the bottom epitaxial layers 154 is formed in the p-MOS region 162, the shape and thickness of the spacers 150, 152 on the vertical structures 130 in the p-MOS region 162 may be differentiated from the shape and thickness of the spacers 150, 152 on the vertical structures 130 in the n-MOS region 164.

Figure 22:
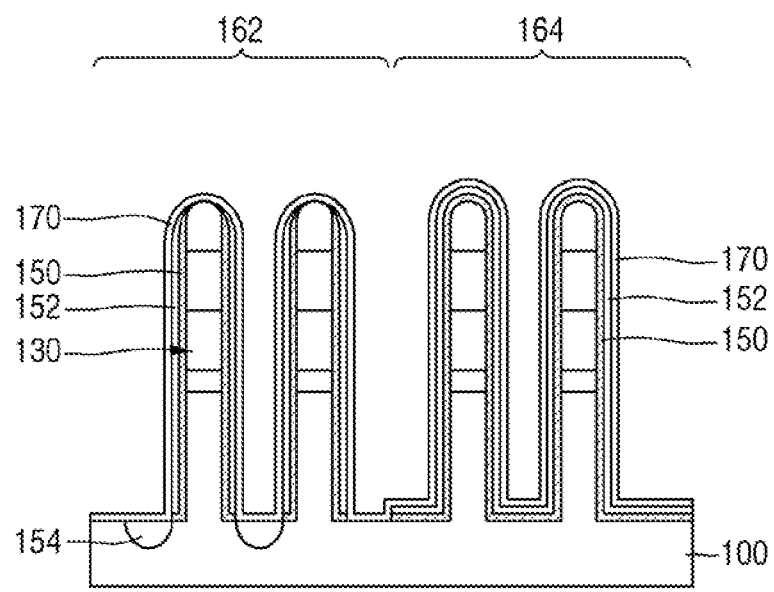
FIG. 22 illustrates cross-sectional view illustrating a method of forming a second nitride spacer during manufacture of a semiconductor device according to an exemplary embodiment of the present inventive concept.

Referring to FIG. 22, a second nitride spacer 170 may be conformally formed according to an exemplary embodiment of the present inventive concept. The second nitride spacer 170 may be formed on the outer surface of the vertical structures 130 to protect the oxide spacer 150 or the first nitride spacer 152 from being further removed in the subsequent etching processes. In one embodiment, the thickness of the second nitride spacer 170 may be determined based on the loss of the first nitride spacer 152 and/or the oxide spacer 150 in the recess formation process in, for example, the p-MOS region 162. After the second nitride spacer 170 is formed on the vertical structures 130 in the both p-MOS region 162 and n-MOS region 164, the combined thickness of the first and second nitride spacers 152, 170 and the oxide spacer 150 at the upper portion of the vertical structures 130 may be thicker for the n-MOS region 164 compared to the p-MOS region 162 since the n-MOS region 164 was protected from the recess forming process in the p-MOS region 162.

Figure 23:
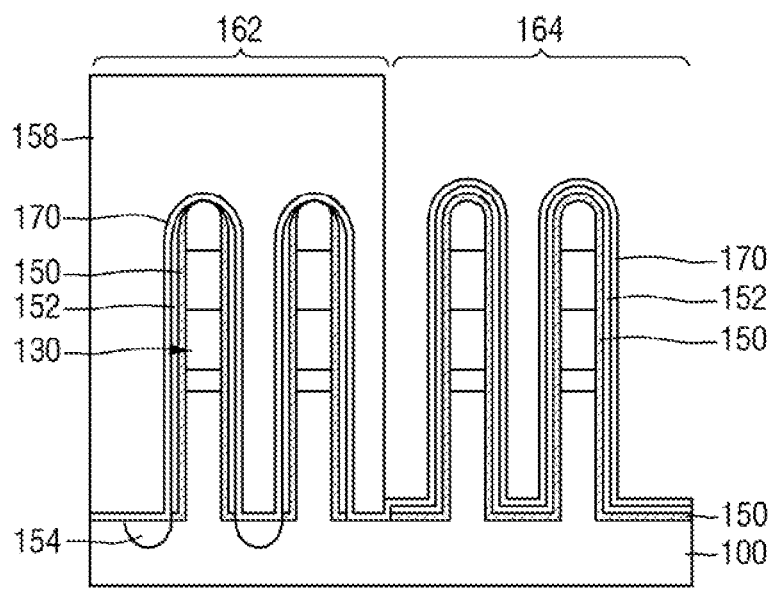
FIGS. 23-25 illustrate cross-sectional views illustrating a method of forming bottom epitaxial layers during manufacture of a semiconductor device according to one or more exemplary embodiments of the present inventive concept.
Figure 24:
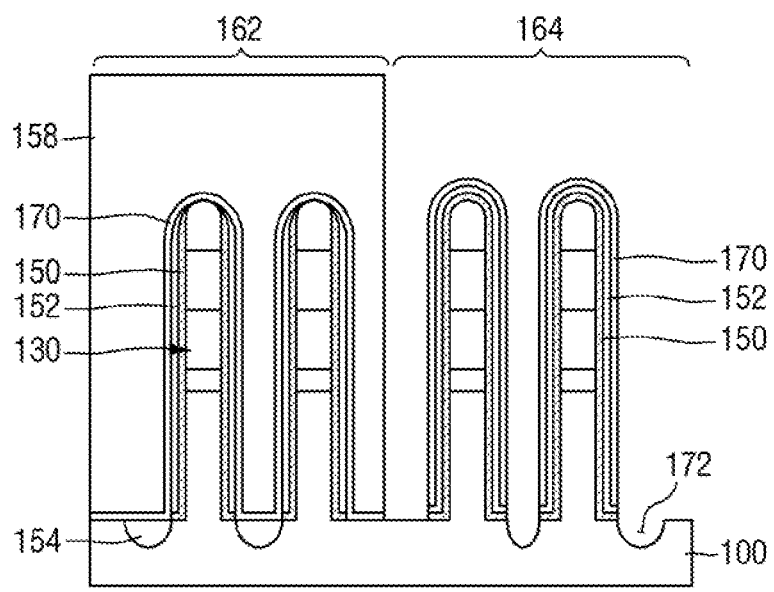
Figure 25:
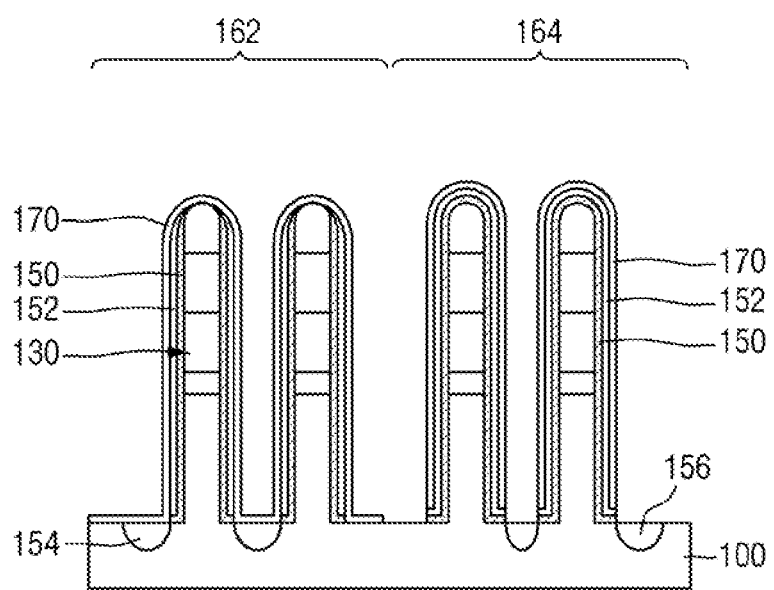

Referring to FIGS. 23-25, a plurality of bottom epitaxial layers may be selectively formed for the other of the p-MOS region 162 or the n-MOS region 164 of the semiconductor device according to one or more exemplary embodiments of the present inventive concept. For example, the insulating layer 158 may be selectively formed on the p-MOS region 162 as shown in, for example, FIG. 23. A portion of the substrate 100 may be etched by, for example, dry etching process using the vertical structures 130 with the oxide spacer 150, the first and second nitride spacers 152, 170 as the mask to form the recesses 172 having a predetermined depth as shown in, for example, FIG. 24.

Referring to FIG. 25, the bottom epitaxial layer 156 may be formed in the recesses 172 in the n-MOS region 164. In one embodiment, the bottom epitaxial layer 156 may be semiconductor material. For example, the bottom epitaxial layer 156 may include silicon (Si), germanium (Ge), silicon-germanium (SiGe) or the like. In one embodiment, ion implantation may be performed to supply either n-type or p-type impurities in the epitaxial layer 156 for modifying electrical properties of the recesses 172 filled with the epitaxial layer 156. For example, for the n-MOS region 164, the epitaxial layer 156 may include n-type dopants, for example, phosphorous (P) or arsenic (As). The present inventive concept, however, is not limited thereto, and other n-type depart materials may be used. When the ion implantation is performed, at a later stage of the manufacturing the semiconductor device, heat treatment may be separately performed at a predetermined temperature to control the diffusion and distribution of the impurities in the epitaxial layer 156

When the recesses 172 are formed in the n-MOS region 164, at least a portion of the first and second nitride spacers 152, 170 and the oxide spacer 150 formed on the second silicon nitride layer 108 in the n-MOS region 164 may be etched down. Accordingly, the combined thickness of the spacers 150, 152, 170 on the second silicon nitride layer 108 may become thinner after the recesses 172 are formed.

Figure 26:
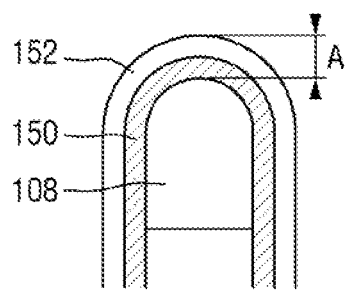
FIG. 26 illustrates cross-sectional views illustrating the dimension changes in the oxide spacer and nitride spacers during manufacture of a semiconductor device according to an exemplary embodiments of the present inventive concept.
Figure 26:
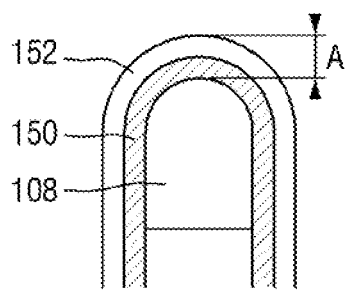
Figure 26:
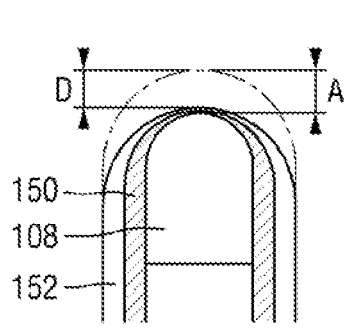
Figure 26:
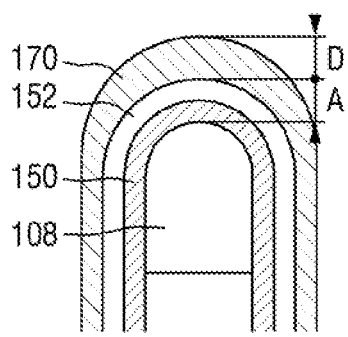
Figure 26:
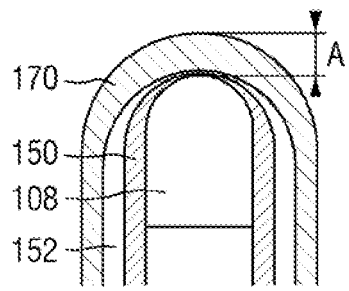
Figure 26:
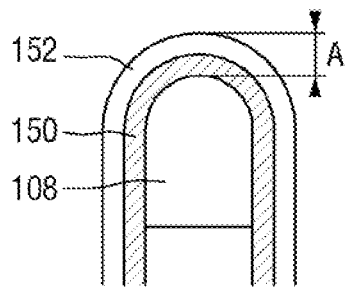

Referring to FIG. 26, the thickness changes for the layers formed on the second silicon nitride layer 108 are schematically illustrated according to an exemplary embodiment of the present inventive concept. It is noted that the drawings in FIG. 26 is merely schematic and are not drawn to scale. FIGS. 26(a)-26(c) may illustrate the thickness changes in the spacers 150, 152, 170 in the p-MOS region 162 while the recesses 168 are formed in the p-MOS region 162. In one embodiment, FIG. 26(a) may illustrate that, prior to the recess formation, the oxide spacer 150 and the first nitride spacer 152 with combined thickness "A" may be formed on the second silicon nitride layer 108. FIG. 26(b) may illustrate that combined thickness for the layers may decrease by "D" due to the reaction with, for example, the ions and other reactive gas species in the dry etching. The dotted line may represent the profile of the first nitride spacer 152 prior to the onset of the recess formation. In one example, "D" may be less than or equal to "A." The present inventive concept, however, is not limited thereto. In another example, depending on the processing conditions for forming recesses 168, "D" may be greater than "A", and an upper portion of the second silicon nitride layer 108 may be etched. FIG. 26(c) may illustrate that the second nitride spacer 170 with thickness "D" may be formed on the first nitride spacer 152 after the completion of the recess formation, to compensate for the loss of the oxide spacer 150 and the first nitride spacer 152 in the etching process in the later stage. In another embodiment, the thickness "D" of the second nitride spacer 170 in FIG. 26(c) may be different from the thickness loss "D" in FIG. 26(b). On the other hand, by forming the second nitride spacer 170, the loss of the second silicon nitride layer 108 may be prevented or minimized.

FIGS. 26(d)-26(f) may illustrate the thickness changes in the n-MOS region 164 while the recess 172 is formed in the n-MOS region 164. In one embodiment, FIG. 26(d) may illustrate that, prior to the recess formation, the oxide spacer 150 and the first nitride spacer 152 with combined thickness "A" may be formed on the second silicon nitride layer 108. FIG. 26(e) may illustrate that the second nitride spacer 170 with thickness "D" may be additionally formed on the first nitride spacer 152 prior to the onset of the recess formation. The combined thickness for the oxide spacer 150, and the first and second nitride spacer 152, 170 formed on the second silicon nitride layer 108 may be "A+D". The second nitride spacer 170 may be formed to compensate for the expected loss of the oxide spacer 150 and the first nitride spacer 152 in the subsequent recess formation process. FIG. 26(f) may illustrate that, for example, the second nitride spacer 170 with thickness "D" may be removed by, for example, the ions and other reactive gas species during the formation of the recess 172. In another example, the entire spacers 150, 152, 170 on the second silicon nitride layer 108 may be removed while the recesses 172 are formed, and a portion of the second silicon nitride layer 108 may be removed.

Due to the second nitride spacer 170 provided to the outer surface of the vertical structures 130, the vertical structure 130 may be protected from being removed in the subsequent etching processes. For example, the damage to the second silicon nitride layer 108 may be minimized or prevented. Either way, the second oxide layer 106, which is positioned under the second silicon nitride layer 108, may still be protected from the etching process. Further, as the height of the vertical structures 130 in the p-MOS region 162 and the n-MOS region 164 may be substantially same with each other, the processing conditions for the recesses 168, 172 in the p-MOS region 162 and the n-MOS region 164 may also be substantially same with each other. Therefore, the process uniformity in forming the recesses 168, 172 in both the p-MOS region 162 and the n-MOS region 164 may be achieved.

Figure 27:
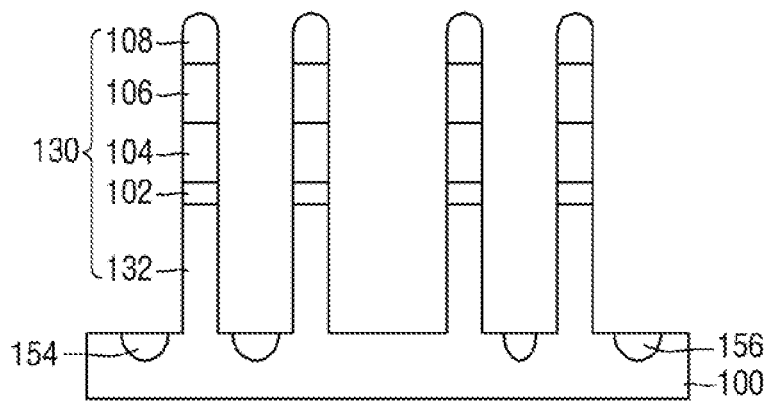
FIG. 27 illustrates cross-sectional view illustrating a method of removing the oxide spacer and nitride spacer during manufacture of a semiconductor device according, to an exemplary embodiment of the present inventive concept.
Figure 28:
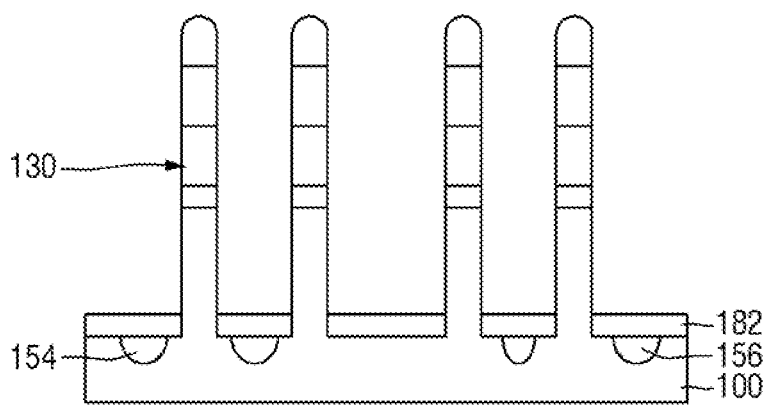
FIG. 28 illustrates cross-sectional view illustrating a method of forming an insulating layer during manufacture of a semiconductor device according to an exemplary embodiment of the present inventive concept.

Referring to FIG. 27, remaining oxide and nitride spacers 150, 152, 170 may be stripped to expose the second silicon nitride layer 108 according to an exemplary embodiment of the present inventive concept. Referring to FIG. 28, an insulating layer 182 may be conformity formed on the outer surface of the vertical structure 130 and the upper surface of the substrate 100. A portion of the insulating layer 182 may be further removed by, for example, dry etching to substantially cover the bottom epitaxial layers 154, 156 as shown in FIG. 28.

Figure 29:
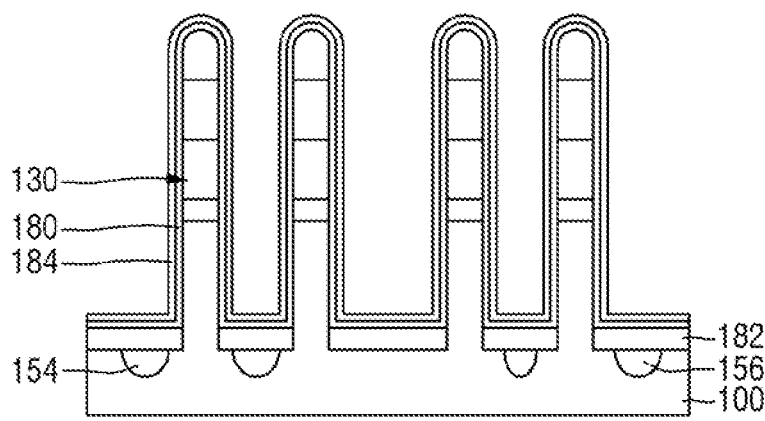
FIG. 29 illustrates cross-sectional view illustrating a method of forming a gate dielectric layer and a gate metal during manufacture of a semiconductor device according to an exemplary embodiment of the present inventive concept.

Referring to FIG. 29, a gate dielectric layer 180 may be formed to cover substantially the entire outer surface of the vertical structure 130 according to an exemplary embodiment of the present inventive concept. For example, the gate dielectric layer 180 may be formed on the bottom epitaxial layers 154, 156. The gate dielectric layer 180 may include, for example, silicon oxide ($SiO_2$), silicon nitride ($Si_3N_4$), silicon oxynitride (SiON), zirconium oxide ($ZrO_2$), zirconium oxynitride (ZrON), hafnium zirconium oxide (HfZiO), aluminum oxide ($Al_2O_3$), tantalum pentoxide ($Ta_2O_5$), or compounds thereof. In another example, the gate dielectric layer 180 may include high K dielectric materials, for example, barium titanate, barium strontium titanate oxide, titanium oxide, or compounds thereof.

In one embodiment, the gate dielectric layer 180 may be directly formed on the bottom epitaxial layers 154, 156. In another embodiment, a bottom oxide layer (not shown) may be formed on the bottom epitaxial layers 154, 156, and the gate dielectric layer 180 is formed on the bottom oxide layer.

FIG. 29 also illustrates that a gate metal 184 may be formed on the gate dielectric layer 180. The gate metal 184 may be formed on the gate dielectric layer 180 by CND or ALD. The gate metal 184 may include, for example, tungsten (W), cobalt (Co), copper (Cu), tantalum (Ta), titanium (Ti), ruthenium (Ru), aluminum (Al), metal carbides, or metal nitrides, for example, titanium nitride (TiN).

Figure 30:
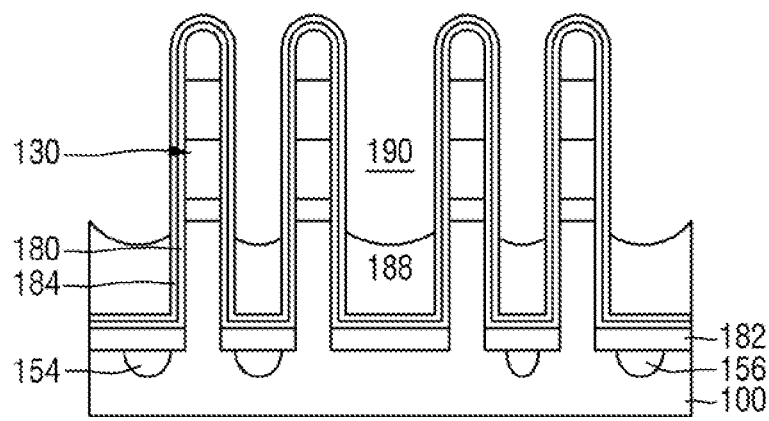
FIGS. 30-31 illustrate cross-sectional views illustrating a method of patterning the gate dielectric layer and the gate metal during manufacture of a semiconductor device according to one or more exemplary embodiments of the present inventive concept.

Referring to FIG. 30, the OPL 188 may be selectively filled in the space 190 between adjacent vertical structures 130 according to an exemplary embodiment of the present inventive concept. In one embodiment, the OPL 188 may be formed on the gate metal 184. A portion of the OPL 188 may be selectively removed by the photolithography process to expose the upper portion of the gate metal 184. For example, the OPL 188 may include a convex shape between the adjacent vertical structures 130.

Figure 31:
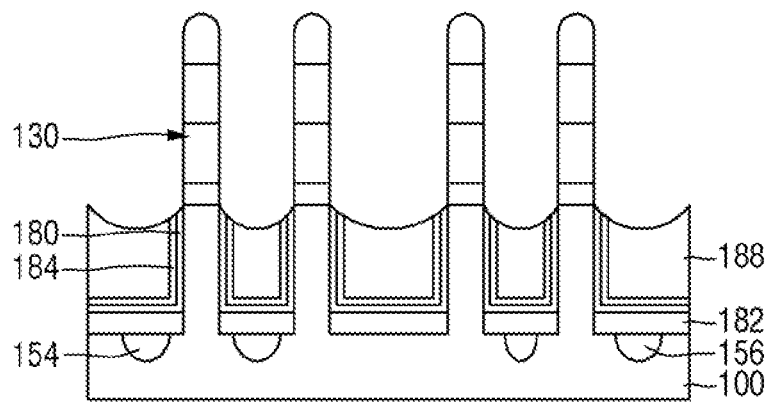

Referring to FIG. 31, a portion of the gate metal 184 may be removed according to an exemplary embodiment of the present inventive concept. The portion of the gate metal 184 may be removed by, for example, the wet etching process or the dry etching process. For example, the etching condition may be such that a lower portion of the gate metal 184 is not removed by the OPL 188 patterns, and the upper portion of the gate metal 184 is removed by the etching process. After the etching of the gate metal 184 is complete, the OPL 188 patterns may be removed.

Figure 32:
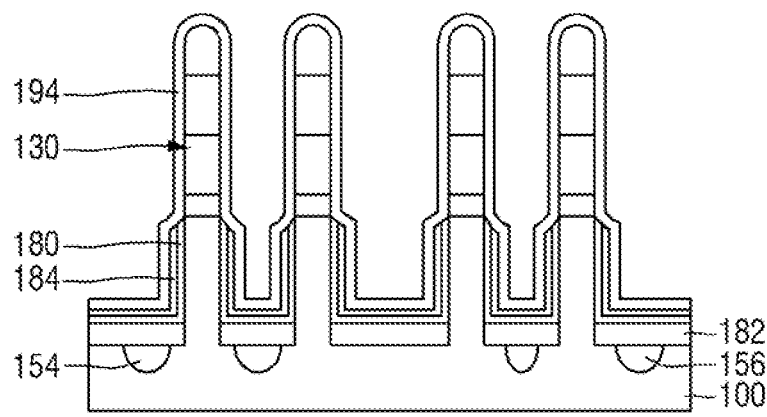
FIG. 32 illustrates cross-sectional view illustrating a method of forming an insulating spacer during manufacture of a semiconductor device according to an exemplary embodiment of the present inventive concept.
Figure 33:
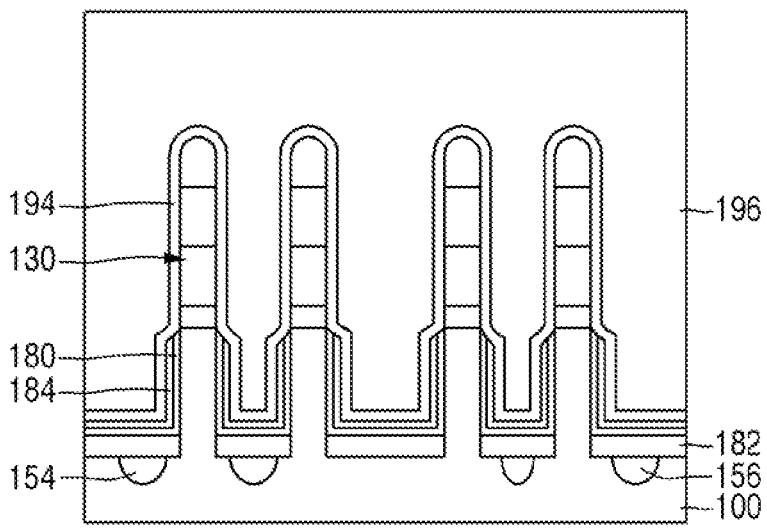
FIG. 33 illustrates cross-sectional view illustrating a method of forming an insulating layer during manufacture of a semiconductor device according to an exemplary embodiment of the present inventive concept.

Referring to FIG. 32, an insulating spacer 194 may be conformally formed to cover the entire surface of the substrate 100 according to an exemplary embodiment of the present inventive concept. The insulating spacer 194 may include, for example, silicon nitride ($Si_3N_4$), and may be formed using, for example, CVD or ALD. Referring to FIG. 33, an insulating layer 196 may be formed to fill the space between the vertical structures 130 according to an exemplary embodiment of the present inventive concept. The insulating layer 196 may be filled using, for example, CVD. The insulating layer 196 may include, for example, silicon oxide.

Figure 34:
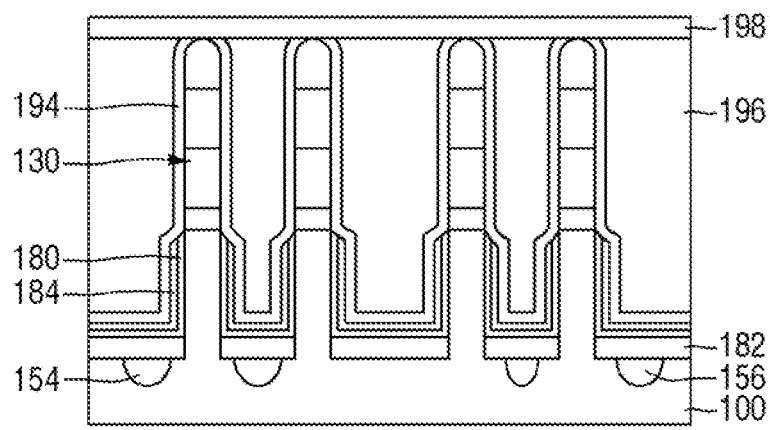
FIG. 34 illustrates cross-sectional view illustrating a method of performing a chemical mechanical planarization (CMP) during manufacture of a semiconductor device according to an exemplary embodiment of the present inventive concept.

Referring to FIG. 34, an upper portion of the insulating layer 196 may be polished by a chemical mechanical planarization (CMP) process to have a fiat and smooth surface according to an exemplary embodiment of the present inventive concept. The CMP process may be performed until the insulating spacer 194 is reached. In one embodiment, the CMP process may not substantially attack the second silicon nitride layer 108 of the vertical structure 130. A stopper 198 may be formed on the upper surface of the insulating layer 196 using, for example, CVD or ALD. The stopper 198 may include, for example, silicon nitride. The stopper 198 may block the etching of the vertical structures 130 in the subsequent etching processes.

Figure 35:
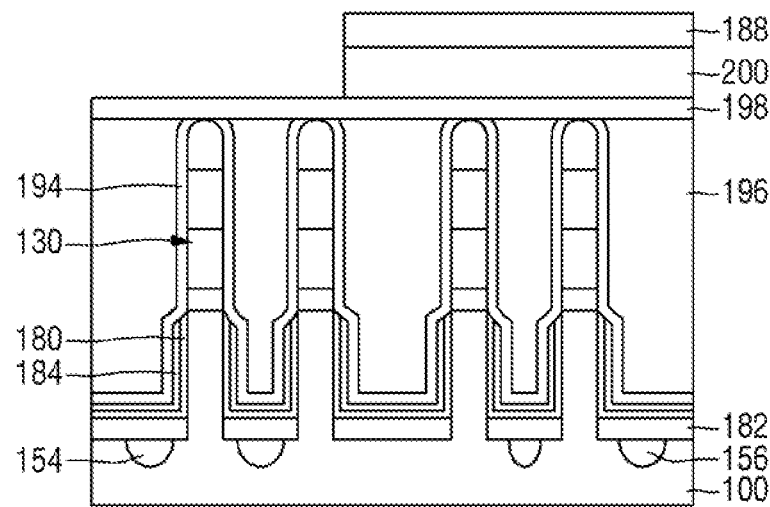
FIG. 35 illustrates cross-sectional view illustrating a method of forming an insulating layer during manufacture of a semiconductor device according to an exemplary embodiment of the present inventive concept.

Referring to FIG. 35, an insulating layer 200 may be formed on the stopper 198 according to an exemplary embodiment of the present inventive concept. The insulating layer 200 may include, for example, silicon oxide, and may be substantially the same as the insulating layer 196. The OPL 188 may be formed on the insulating layer 200 for forming the patterns and selectively removing a portion of the insulating layer 200 using the OPL 188 as the mask. In one embodiment, other photosensitive polymers may be used in replace of the OPL 188.

Figure 36:
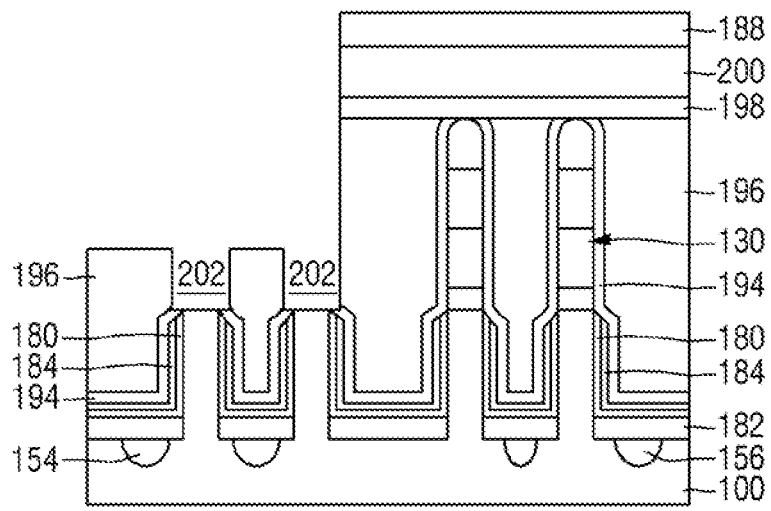
FIG. 36 illustrates cross-sectional view illustrating a method of removing a portion of vertical structure during manufacture of a semiconductor device according to an exemplary embodiment of the present inventive concept.

Referring to FIG. 36, a portion of the stopper 198 may be removed according to an exemplary embodiment of the present inventive concept. The portion of the stopper 198 may be removed by, for example, dry etching. In one embodiment, the portion of the stopper 198 corresponding to the p-MOS region may be selectively removed by the dry etching process, to expose the insulating layer 196.

The insulating spacer 194, the second silicon nitride layer 108, the second oxide layer 106, the first silicon nitride layer 104, and the first oxide layer 102 may be removed by, for example, dry etching to form a recess 202 for growing the top epitaxial layer 204. The top epitaxial layer 204 may include, for example, a top epitaxial layer. As shown in FIG. 36, the insulating layer 196 may separate adjacent vertical structures 130 from each other.

Figure 37:
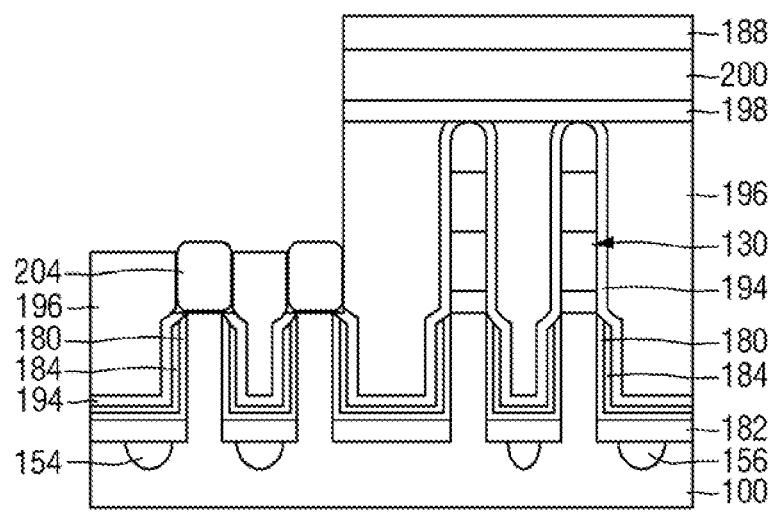
FIG. 37 illustrates cross-sectional view illustrating a method of growing a top epitaxial layer during manufacture of a semiconductor device according to an exemplary embodiment of the present inventive concept.

Referring to FIG. 37, the top epitaxial layer 204 may be formed on the channel 132 using an upper surface of the channel 132 as a mould for epitaxial layer growth according to an exemplary embodiment of the present inventive concept. The top epitaxial layer 204 may be formed using, for example, CVD or a molecular beam epitaxy (MBE), and may include, for example, silicon (Si), germanium (Ge), silicon-germanium (SiGe) or the like. As shown, the growth of the top epitaxial layer 204 may be controlled by the insulating layer 196. For example, the adjacent top epitaxial layers 204 may not contact each other by the presence of the insulating layer 196.

While the present inventive concept has been particularly shown and described with reference to exemplary embodiments thereof, it will be understood by those of ordinary skill in the art that various changes in form and details may be made therein without departing from the spirit and scope of the disclosure.

What is claimed is:

1. A method for manufacturing a semiconductor device, the method comprising:
    forming a channel extending from a substrate;
    forming a first oxide layer, a first nitride layer, a second oxide layer, and a second nitride layer sequentially on the channel to form a vertical structure;
    forming an oxide spacer on an outer surface of the vertical structure;
    forming a first nitride spacer on the oxide spacer; and
    forming a second nitride spacer on the outer surface of the vertical structure.

2. The method of claim 1, wherein the forming the second nitride spacer comprises forming the second nitride spacer on the second nitride layer of the vertical structure.

3. The method of claim 1, further comprising:
    removing at least a portion of the oxide spacer or the first nitride spacer after the first nitride spacer is formed on the oxide spacer.

4. The method of claim 3, wherein the removing at least the portion of the oxide spacer or the first nitride spacer occurs while one or more recesses are formed in the substrate.

5. The method of claim 3, wherein the removing at least the portion of the oxide spacer or the first nitride spacer comprises etching at least the portion of the oxide spacer or first nitride spacer using one of a dry etching or a wet etching.

6. The method of claim 1, further comprising:
    removing at least a portion of the oxide spacer, the first nitride spacer, or the second nitride spacer after the second nitride spacer is formed on the vertical structure.

7. The method of claim 6, wherein the removing at least the portion of the oxide spacer, the first nitride spacer, or the second nitride spacer occurs while one or more recesses are formed in the substrate.

8. The method of claim 6, wherein the removing at least the portion of the oxide spacer, the first nitride spacer, or the second nitride spacer comprises etching at least the portion of the oxide spacer, the first nitride spacer, or the second nitride spacer using one of a dry etching or a wet etching.

9. A method for manufacturing a semiconductor device including a first region and a second region, the method comprising;
    forming a first plurality of vertical structures, and a second plurality of vertical structures, each of the vertical structures including a vertical channel, a first oxide layer, a first nitride layer, a second oxide layer, and a second nitride layer;
    forming a oxide spacer on an outer surface of the each of the vertical structures;
    forming a first nitride spacer on the oxide spacer;
    covering the first plurality of vertical structures using a first mask to expose the second plurality of vertical structures;
    removing a portion of a substrate between the second plurality of vertical structures;
    removing the first mask;
    forming a second nitride spacer on the outer surface of the first and second pluralities of vertical structures;
    covering the second plurality of vertical structures using a second mask to expose the first plurality of vertical structures;
    removing a portion of the substrate between the first plurality of vertical structures; and
    removing the second mask;
    wherein the first plurality of vertical structures is in the first region, and the second plurality of vertical structures is in the second region.

10. The method of claim 9, wherein the first region comprises one of an n-MOS region or a p-MOS region, and the second region comprises the other of the n-MOS region or the p-MOS region.

11. The method of claim 9, wherein the removing the portion of the substrate comprises forming one or more recesses in the substrate.

12. The method of claim 9, wherein the removing the first and second masks comprises removing the first and second masks by a photolithography process.

13. The method of claim 9, wherein the first mask and the second mask includes organic planarization layer (OPL).

* * * * *